(12) United States Patent
Mo

(10) Patent No.: US 6,472,820 B1
(45) Date of Patent: Oct. 29, 2002

(54) PLASMA DISPLAY PANEL

(75) Inventor: Bu-kyeong Mo, Cheonan (KR)

(73) Assignee: Samsung SDI Co., Ltd., Suwon (KR)

( * ) Notice: Subject to any disclaimer, the term of this patent is extended or adjusted under 35 U.S.C. 154(b) by 161 days.

(21) Appl. No.: 09/608,741

(22) Filed: Jun. 30, 2000

(30) Foreign Application Priority Data

Jul. 13, 1998 (KR) .............................. 99-28199

(51) Int. Cl.$^7$ ................................ H01J 17/00
(52) U.S. Cl. ...................... 313/581; 313/583
(58) Field of Search ................. 313/581, 583, 313/318.01, 318.12; 315/169.4; 345/60, 41

(56) References Cited

U.S. PATENT DOCUMENTS 3,868,676 A * 2/1975 Hennessey et al. . 313/318.12 X
3,962,597 A * 6/1976 Clark et al. ......... 313/318.12 X
4,039,882 A * 8/1977 Kupsky et al. ..... 313/318.01 X

* cited by examiner

*Primary Examiner*—Ashok Patel
(74) *Attorney, Agent, or Firm*—Leydig, Voit & Mayer, Ltd.

(57) ABSTRACT

A plasma display panel includes input terminals, each input terminal having conductive lines to be connected to conductive lines in an connection cable, and a connection cable, wherein each of the input terminals has a first alignment mark, having a first portion and a second portion, and the connection cable has a second alignment mark, having a third portion and a fourth portion, the first and third portions and the second and fourth portions having, respectively, the same shapes for alignment with each other.

4 Claims, 5 Drawing Sheets

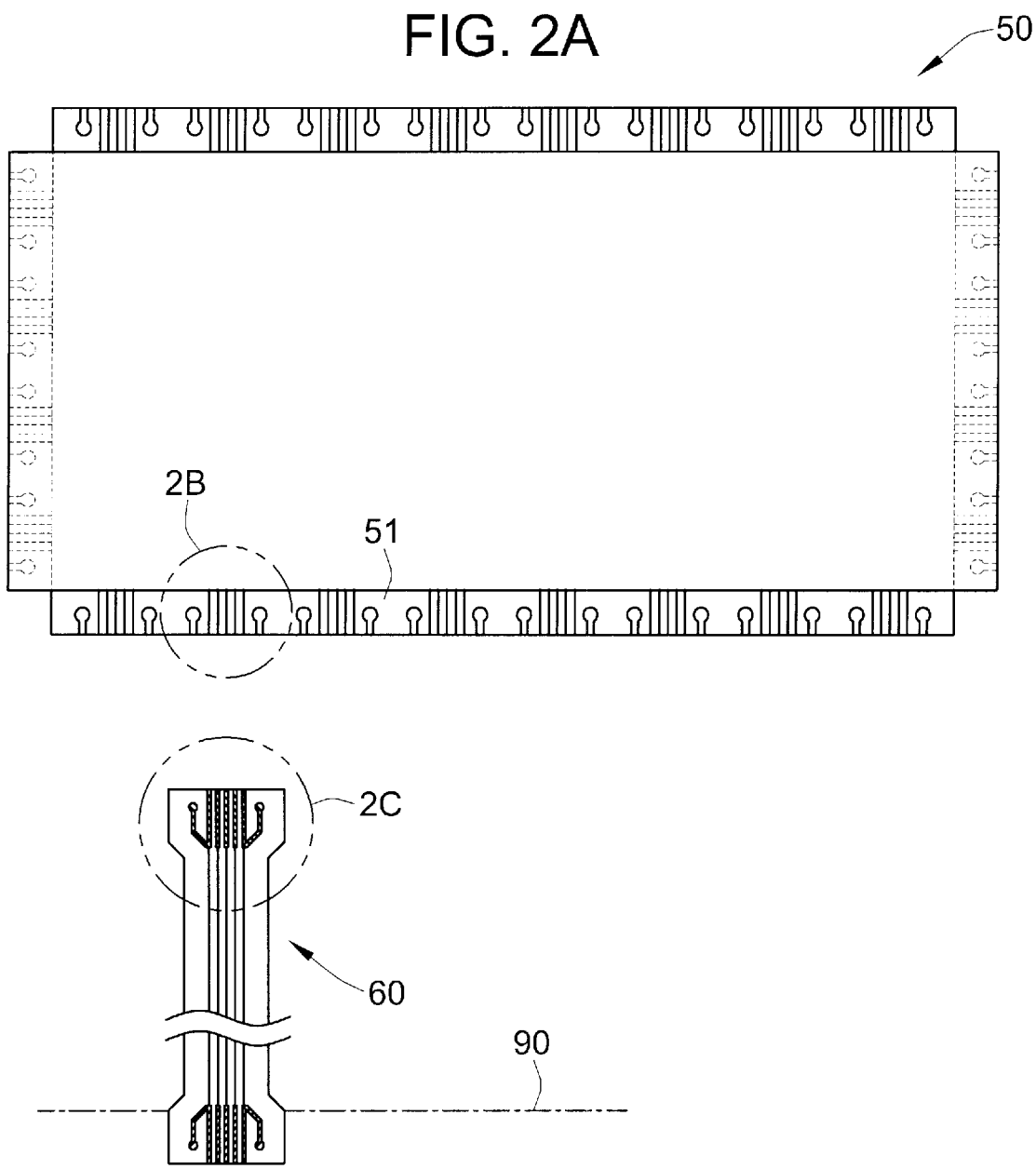

PLASMA DISPLAY PANEL

BACKGROUND OF THE INVENTION

1. Field of the Invention

The present invention relates to a PDP display and more particularly to an alignment process for aligning the input terminals of a plasma display panel and printed circuit cable.

2. Description of the Related Art

Referring to FIG. 1, a plasma display panel comprises a front glass substrate 10 and a rear glass substrate 20 spaced apart from each other. The front substrate 10 has a plurality of pairs of scan electrodes on a surface facing the rear substrate 20. Likewise, the rear substrate 20 has a plurality of address electrodes on a surface facing the front substrate 10. The front and rear substrates 10, 20 are disposed such that their electrodes are orthogonal to each other. On top of the scan electrodes are a dielectric layer and an MgO protective layer. A dielectric layer is also provided on top of the address electrodes on the rear substrate 20. Further a plurality of phosphor-coated parallel walls are erected thereupon to define cells. An inactive gas such as argon is injected into the cells after the substrates are sealed at their periphery and evacuated. The PDP displays images when the inactive gas such as argon and/or neon discharges to become a plasma in response to a high voltage difference between the electrodes and ultraviolet light emitted during discharge collides with the phosphor material coating on the walls of the cells to cause visible light emission. Driving signals are generated from a driving circuit board 30 and applied to the input terminals which are terminal ends of electrodes embedded in the substrates via a cable such as a flexible printed circuit 40. One end of the flexible printed circuit (FPC) 40 and the input terminals of the substrates are provided with circular or rectangular alignment marks. However, these conventional alignment marks were designed for automated connection of the flexible printed circuit 40 to the input terminals on the PDP substrates. Thus it is difficult to manually align the FPC to the terminals. Misalignment would cause a short circuit producing defective devices.

SUMMARY OF THE INVENTION

To solve the above problems, it is an objective of the present invention to provide a plasma display panel having an improved alignment marks on terminal ends of two connecting elements such that they can be more precisely aligned even in a manual connection Accordingly, to achieve the above objective, there is provided a plasma display panel, which comprising a plurality of input terminals, each of which has a first plurality of conductive lines to be connected to a second plurality of conductive lines in an connection cable, wherein each of said input terminals has a first alignment mark, having a first portion and a second portion, and each of said connection cable has a second alignment mark, having a third portion and a fourth portion.

It is preferred in the present invention that the first and third portions are round, and said second and fourth portions are rectangular extending from said first and third portions, respectively.

Also, it is preferred in the present invention that the alignment marks are gold.

BRIEF DESCRIPTION OF THE DRAWINGS

The above objective and advantages of the present invention will become more apparent by describing in detail a preferred embodiment thereof with reference to the attached drawings in which:

FIGS. 2A and 2B are views showing alignment marks generally and in detail on the PDP terminal, respectively.

DETAILED DESCRIPTION OF THE INVENTION

Figure 1:
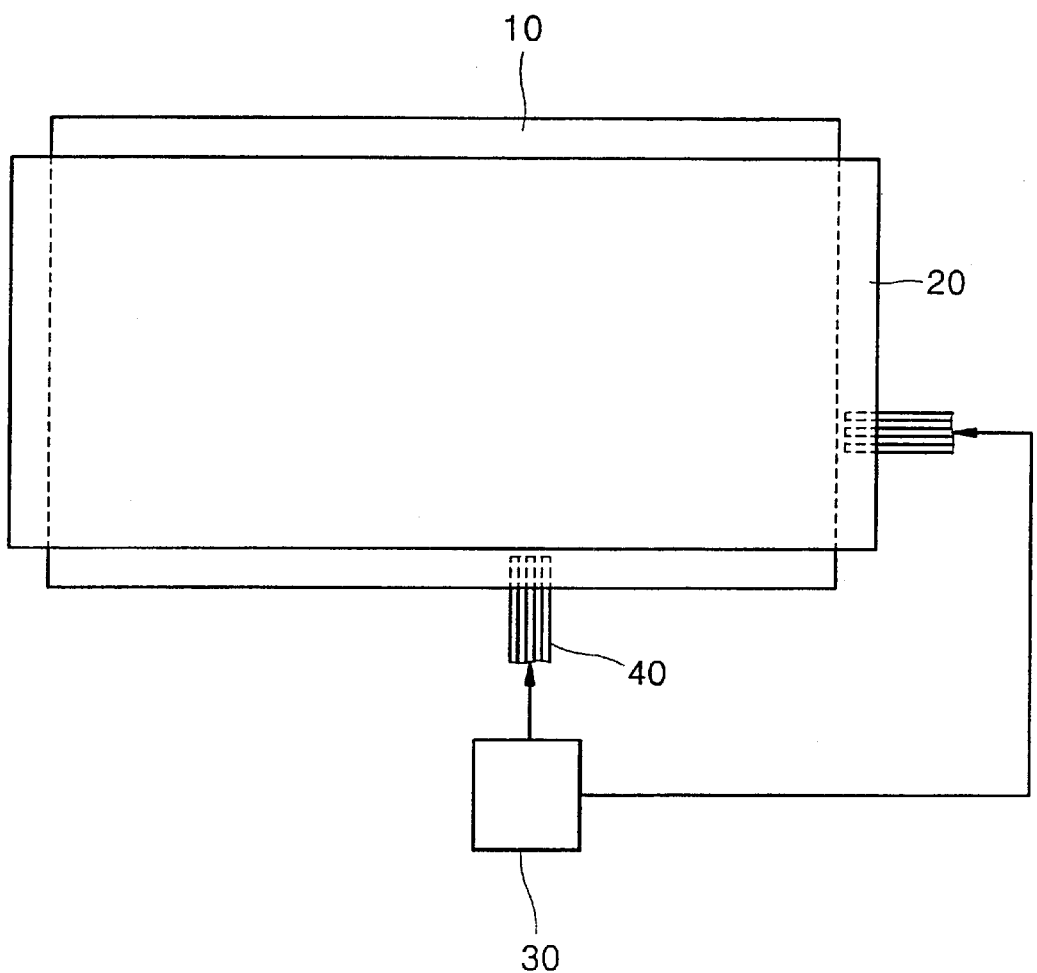
FIG. 1 is a view showing a conventional PDP substrates connected to a driving circuit via flexible printed circuits.
Figure 2B:
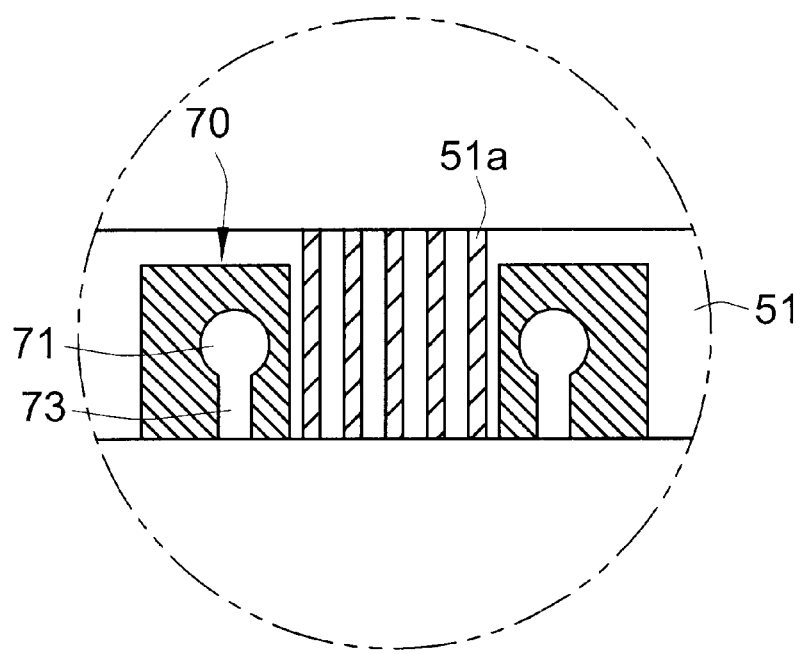
Figure 2C:
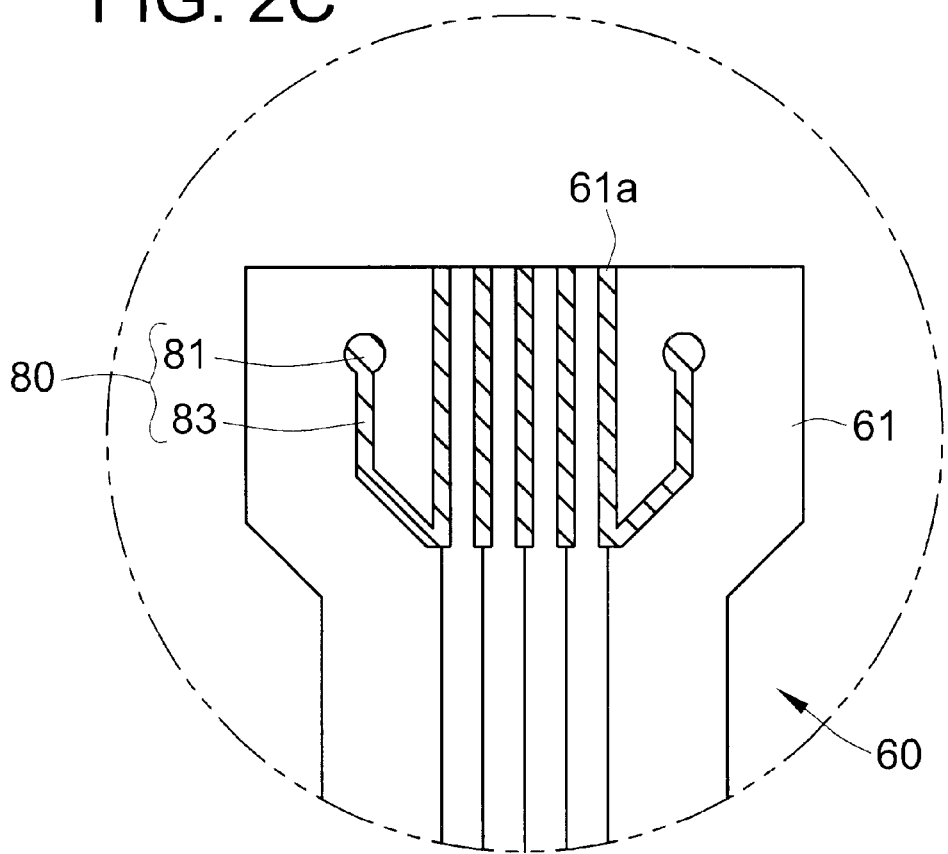
FIG. 2C is a view of a connection cable, according to the present invention prior to connection.

Referring to FIG. 2A, 2B, and 2C the present invention will be described. Each of the front and rear substrates of a plasma display panel 50 has a plurality of input terminals 51 on two opposite sides. One of them is shown in detail in FIG. 2B with a plurality of conductive lines 51a, is coupled to corresponding conductive lines 61a in a terminal end 61 of a flexible printed circuit 60 shown in FIG. 2C. The other end of the flexible printed circuit is connected to the PDP driving circuit board 90. The alignment marks 70, 80 are provided in a predetermined pattern right next to the conductive lines of the input terminal and the flexible printed circuit, respectively. Preferably, the alignment mark 70 in the input terminal has a somewhat square shape with a shape of a key hole, having a circle 71 and long rectangular body 73, cut out as shown in the figures. The alignment mark 70 on the input terminal may be a thin plate and bonded to the terminal. Alternatively, the alignment mark 70 can be a coating of silver directly on a terminal surface. The alignment mark 80 on the FPC 60 is shaped to fit in with the align mark 70 on the input terminal 51 and has a circular head 81 and a rectangular body 83 at a slightly smaller scale so that when the FPC 60 is placed over the input terminal 51 for bonding, the mark 80 does not completely overlap the mark 70. In other words the diameter of the circular head 81 is smaller than that of the cut-out circular head 71 and the rectangular body 83 is narrower than that the rectangular cut-out 73. Also, the alignment mark 80 is a coating of gold directly on the FPC surface.

Figure 3A:
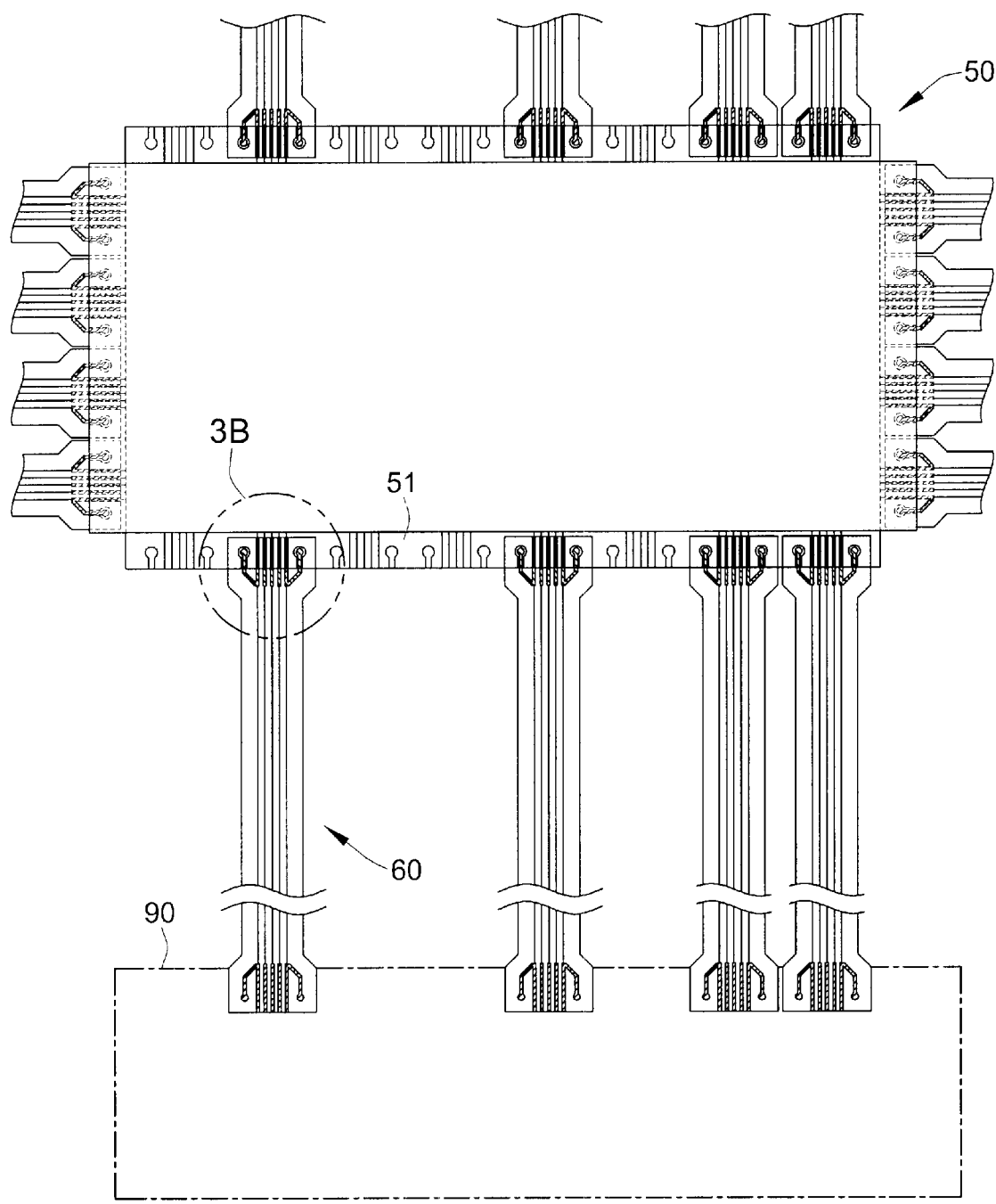
FIGS. 3A and 3B are views showing aligned alignment marks on the PDP terminals and connection cable in general and in detail, respectively, according to the present invention after connection.
Figure 3B:
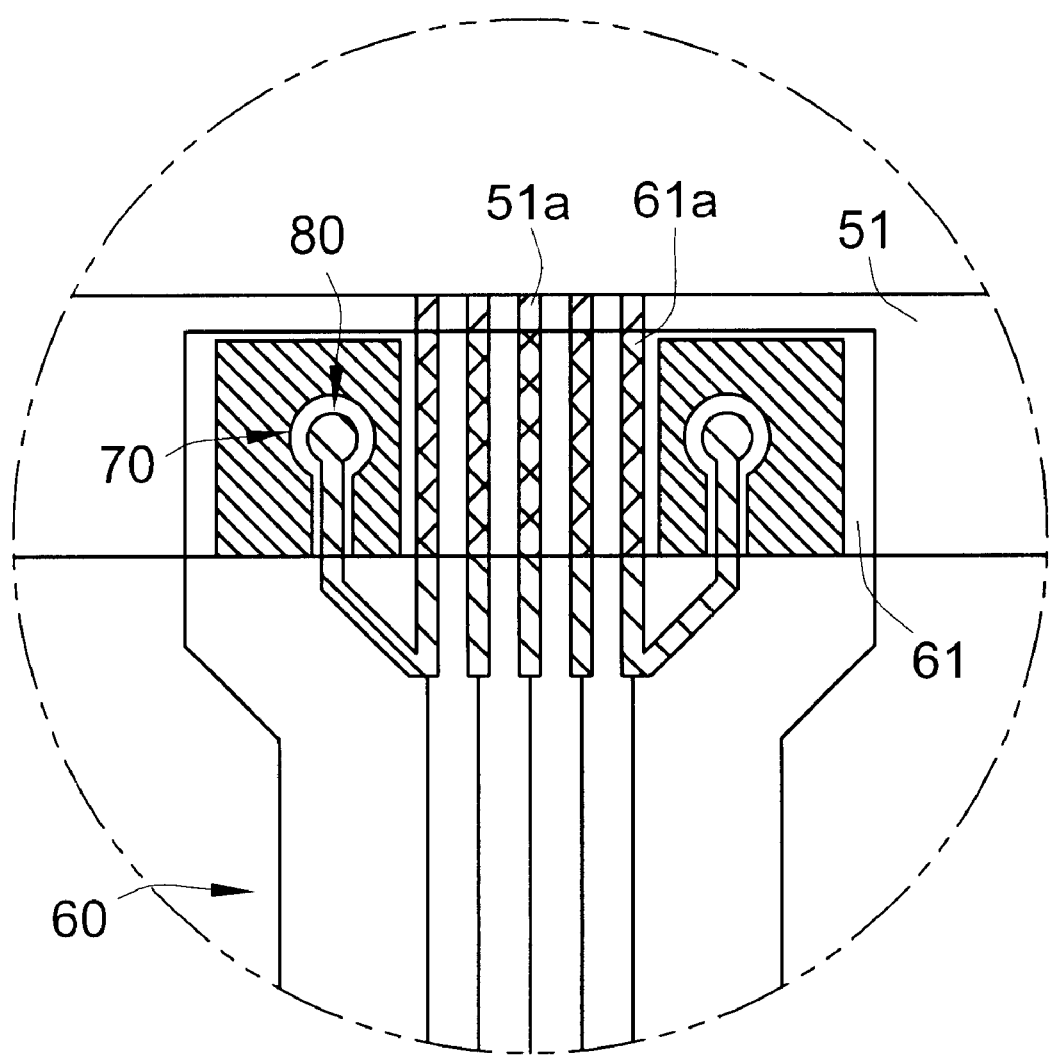

Referring to FIG. 3A and 3B, alignment and connection of the terminals and the printed flexible circuit will be described. First an automated process is explained. The input terminal 51 is cleaned with an alcohol-soaked cloth. The flexible printed circuit 60 with an anisotropic conductive film already adhered is positioned over the input terminal 51. An inspection camera monitors whether the heads 71, 81 of the alignment marks 70, 80 are aligned to ensure the conductive lines 51a, 61a are fully aligned. Gold(Au) coated alignment mark 80 allows easy and fast recognition by the inspection camera so that alignment is more precise and faster. Once it is determined that the conductive lines 51a, 61a are aligned, the flexible printed circuit 60 is pressed against the input terminal 51 at a temperature of 100 degrees for 2 to 5 seconds before the temperature and the pressure are increased to 170 to 180 degrees and 30 Kg/cm2 for about 20 seconds. By this process the input terminals 51 and FPCs 60 are electrically coupled. The present invention is particularly useful when an automated connection process is down for one reason or another so that manual connection is required. The heads 71, 81 of the alignment marks 70, 80 are manually aligned. Next the bodies 73, 83 of the marks are matched manually. Once the mark 80 is completely fit in its corresponding mark 70, one who is performing a manual connection is assured that the conductive lines 51a, 61a of the input terminal 51 and the FPC 60 are in line. Then as is done conventionally, the two are pressed against each other at the temperature of 100 degrees for 2 to 5 seconds before the temperature and the pressure are increased to 170 to 180 degrees and 30 Kg/cm2 for about 20 seconds. By this process the input terminals 51 and FPCs 60 are electrically coupled.

What is claimed is:

1. A plasma display panel comprising:

a connection cable, and a plurality of input terminals, each input terminal having a first plurality of conductive lines to be connected to respective lines of a second plurality of conductive lines in said connection cable, wherein each of said input terminals has a first alignment mark, having a first portion and a second portion, and said connection cable has a second alignment mark, having a third portion and a fourth portion, the first and third portions and the second and fourth portions having, respectively, the same shapes for alignment with each other.

2. The plasma display panel as claimed in claim 1, wherein said first and third portions are circular, and said second and fourth portions are rectangular and extend from said first and third portions, respectively.

3. The plasma display panel as claimed in claim 1, wherein said alignment marks are a gold coating.

4. The plasma display panel as claimed in claim 2, wherein said alignment marks are a gold coating.

* * * * *